United States Patent
Knopf et al.

(10) Patent No.: US 7,573,024 B2
(45) Date of Patent: Aug. 11, 2009

(54) FLEXIBLE BIOELECTRONIC PHOTODETECTOR AND IMAGING ARRAYS BASED ON BACTERIORHODOPSIN (BR) THIN FILMS

(75) Inventors: George Karl Knopf, London (CA); Wei Wei Wang, London (CA); Amarjeet S. Bassi, London (CA)

(73) Assignee: The University of Western Ontario, London (CA)

( * ) Notice: Subject to any disclaimer, the term of this patent is extended or adjusted under 35 U.S.C. 154(b) by 115 days.

(21) Appl. No.: 12/000,093

(22) Filed: Dec. 7, 2007

(65) Prior Publication Data

US 2009/0032683 A1    Feb. 5, 2009

Related U.S. Application Data

(60) Provisional application No. 60/874,254, filed on Dec. 12, 2006.

(51) Int. Cl.
*H01J 5/02* (2006.01)
*H01L 31/00* (2006.01)

(52) U.S. Cl. .................. 250/239; 250/214.1

(58) Field of Classification Search .......... 250/214.1, 250/214 R, 208.1, 239; 257/257, 258, 290–294, 257/431–435; 348/308
See application file for complete search history.

(56) References Cited

U.S. PATENT DOCUMENTS

| | | | |
|---|---|---|---|
| 4,647,161 A | | 3/1987 | Muller |
| 4,804,834 A | * | 2/1989 | Katsura et al. .......... 250/214.1 |
| 5,260,559 A | | 11/1993 | Miyasaka |
| 5,438,192 A | * | 8/1995 | Kaplan et al. .......... 250/214.1 |
| 5,627,616 A | | 5/1997 | Sergeant |
| 5,920,337 A | | 7/1999 | Glassman |
| 6,304,285 B1 | | 10/2001 | Geng |
| 6,548,751 B2 | * | 4/2003 | Sverdrup, Jr. et al. ....... 136/260 |
| 6,977,160 B2 | | 12/2005 | Yanagawa |
| 2002/0126877 A1 | * | 9/2002 | Sugiyama et al. .......... 382/107 |

FOREIGN PATENT DOCUMENTS

| | | |
|---|---|---|
| JP | 3237769 | 10/1991 |
| JP | 4006420 | 1/1992 |
| JP | 6235606 | 8/1994 |

* cited by examiner

*Primary Examiner*—Que T Le
*Assistant Examiner*—Jennifer Bennett
(74) *Attorney, Agent, or Firm*—Lynn Schmacher; Hill & Schumacher (57) ABSTRACT

The direct deposit of photoelectric materials onto low-cost prefabricated patterned flexible electrodes provided by the present invention introduces a new design approach that permits the development of innovative lightweight, durable and non-planar sensing systems. By extending single and multi-spectral bioelectronic sensing technology to flexible plastic substrates, the invention offers a number of potential advantages over structurally rigid silicon-based microelectronics (e.g. CMOS) including a reduction in spatial requirements, weight, electrical power consumption, heat loss, system complexity, and fabrication cost.

39 Claims, 7 Drawing Sheets

FIGURE 1a

Section A-A

FLEXIBLE BIOELECTRONIC PHOTODETECTOR AND IMAGING ARRAYS BASED ON BACTERIORHODOPSIN (BR) THIN FILMS

CROSS REFERENCE TO RELATED U.S. APPLICATION

This patent application relates to, and claims the priority benefit from, U.S. Provisional Patent Application Ser. No. 60/874,254 filed on Dec. 12, 2006, filed in English, which is incorporated herein by reference in its entirety.

FIELD OF THE INVENTION

This invention relates to photodetector arrays that use light sensitive protein thin films and flexible printed electronic circuits for creating flexible large-area and wide field-of-view (FOV) imaging systems that may be shaped into nonplanar configurations.

BACKGROUND OF THE INVENTION

The functionality and performance of conventional digital cameras are often limited by the photo-electronic sensor and optical technologies used to capture two-dimensional planar images of 3D scene. The flat sensor array is composed of numerous single-sized, rectangular shaped, and uniformly distributed light sensing elements fabricated on a rigid silicon substrate using very-large scaled integration (VLSI) design processes. Complex and heavy optical assemblies comprised of specialized lens and mirrors are often required to enable images with a wide filed-of-view (FOV) to be captured. An illustration of a specialty lens is a wide-angle "fish-eye" lens (U.S. Pat. No. 6,304,285B1 and U.S. Pat. No. 4,647,161). However, optical solutions for enlarging the FOV often lead to significant image distortion which must be corrected by sophisticated computational algorithms.

The limited FOV provided by commercially available digital sensors has been increased by implementing an active pan-tilt platform that dynamically repositions the sensor about the center of projection (U.S. Pat. No. 5,627,616). The speed in which the camera can be reoriented during data acquisition has greatly reduced the effectiveness these systems. An alternative approach to creating a wide FOV involves numerous cameras pointing in different directions (U.S. Pat. No. 5,920,337). However, it is difficult to seamlessly register and integrate multiple views because the constituent images are produced by unique cameras with different centers of projection. This technology is difficult to calibrate, prone to alignment errors and requires significant hardware for a full 360° view.

The physical restrictions and limited performance capability of silicon-based technologies have prompted researchers to look at biological materials as a means of improving detector characteristics, and simplifying the design and fabrication of non-traditional imaging systems. Biomaterials such as; bacteriorhodopsin (bR) exhibit photoresponse characteristics similar to the rhodopsin found in mammalian vision systems including high sensitivity and large dynamic range. Bacteriorhodopsin is the light-harvesting protein present in the plasma membrane of *Halobacterium salinarium*. Under anaerobic conditions the bacterium's membrane grows purple membrane (PM) patches in the form of a hexagonal two-dimensional crystalline lattice of uniformly oriented bR trimers. It is the crystalline structure that provides bR with chemical and thermal stability thereby making it a useful material for developing artificial vision systems.

A number of different photosensitive devices have been created by immobilizing PM patches onto a rigid substrate such as silica glass coated by conductive tin or indium tin oxides, and metal electrodes such as gold and platinum (J.P. Pat. No. 04006420A2 and U.S. Pat. No. 5,260,559). In this context, a 16×16 pixel array of bR photocells was fabricated on the conductive solid substrate for image detection (U.S. Pat. No. 5,260,559 and U.S. Pat. No. 6,977,160). The differential response exhibited by each bR photocell in the spatial array provided the necessary photoelectric signal for motion detection. Similarly, a position-sensitive motion sensor using the image-recording capability of bR at high pH was patented (J.P. Pat. No. 06235606A2). Recently, the gate terminal of a GaAs-based MOSFET and nano-black lipid membranes (J. Xu et al., 2004, C. Horn and C. Steinem, 2005) has been explored as a viable; technology for micro and nano applications.

A color sensor that consisted of a blue-, green-, and red-sensitive chromoprotein thin films was developed (J.P. Pat. No. 03237769A2). Furthermore, a dynamic adaptive camouflage system was created by mounting the bR photodetectors and display devices on an apparatus and displaying a spatially shifted image of the incident ambient light (U.S. Pat. No. 5,438,192).

It would be very advantageous to provide single and multi-spectral bioelectronic sensing technology fabricated on bendable or flexible plastic substrates. The direct deposit of photosensitive materials onto low-cost flexible printed electronic circuits would enable design engineers to create innovative lightweight, durable and non-planar image sensing systems for example, such as spherical or omni-directional photodetector array based on bR films can be used in a variety of imaging applications including motion detection, robotic and vehicle navigation. It would be very beneficial to develop photo-responsive sensors that can be adhered permanently to non-planar customized surfaces.

SUMMARY OF THE INVENTION

The present invention provides a method of designing and manufacturing non-planar photodetector arrays that exploit light sensitive protein thin films and flexible printed electronic circuits for creating large-area and wide field-of-view (FOV) imaging systems.

In one aspect of the present invention there is provided a flexible photodetector array, comprising of:

a first flexible polymer sheet coated with a continuous electrically conducting film forming one of an anode and a cathode electrode, a second flexible polymer sheet having a patterned coating of a electrically conducting film forming the other electrode, the patterned coating corresponding to a desired pattern of pixels, at least one of the first flexible polymer sheet coated with a continuous, electrically conducting film and the second flexible polymer sheet having a patterned coating of a electrically conducting film being substantially transparent;

a thin film containing one or more layers of oriented purple membrane patches containing bacteriorhodopsin (bR), or an analog thereof, sandwiched between the first and second flexible polymer sheets with the electrically conducting film physically contacting one side of the thin film and the patterned coating of an electrically conducting film contacting an opposed side of the thin film to form a pixel array of sensing elements; and the continuous, electrically conducting film and the patterned coating of an electrically conducting film being electrically connected to a signal processing circuit.

In another aspect of the invention there is provided a method of fabricating a flexible photodetector array, comprising the steps of:

a) coating a first flexible polymer sheet with a continuous electrically conducting film;

b) coating a second flexible polymer sheet with a patterned coating of an electrically conducting film, the patterned coating corresponding to a desired pattern of sensing elements, at least one of the first flexible polymer sheet coated with a continuous, electrically conducting film and the second flexible polymer sheet having a patterned coating of a electrically conducting film being substantially transparent;

c) orienting the purple membrane patches containing (bR), or an analog thereof, and forming a film containing one or more layers of oriented purple patches and immobilizing the film onto the flexible polymer sheet coated with the patterned electrically conducting film; and d) affixing the film containing one or more layers of oriented purple membrane patches between the first and second flexible polymer sheets, with the electrically conducting film physically contacting one side of the film and the patterned coating of an electrically conducting film contacting an opposed side of the film to form an array of sensing elements and sealing peripheral edges of the first and second flexible polymer sheets.

The flexible photoconductor array may be formed into a desired planar shape and then affixed to a non-planar surface. Alternatively it may be shaped into a desired non planar shape without being affixed to a surface.

Thus, to fabricate this novel technology, purple membrane patches obtained from *Halobacterium salinarium* are deposited onto a polymer film, such as, but not limited to, polyethylene terephthalate (PET) substrate coated with a patterned electrical conductor such as, but not limited to, indium-tin-oxide (ITO) layer using a deposition technique, such as, but not limited to, the Electrophoretic Sedimentation (EPS) technique in which the step of orienting the purple membrane patches containing bR includes locating the purple patches between a flexible polymer sheet having the pixel pattern of the conductive film designated an anode and a continuous planar cathode electrode and applying an electric field of suitable strength between the planar cathode and anode electrodes such that a cytoplasmic side of the purple membrane patches attaches to the anode electrode electrophoretically and an extracellular side of the purple membrane patches faces to the cathode electrode.

The conductive layer is preferably a metal oxide such as indium tin oxide (ITO) and may be deposited onto the flexible plastic substrate via pulsed laser deposition.

To detect multi-spectral or color images the peak response and signal bandwidth of the individual elements can be modified through chemical or genetic manipulation. Chemical manipulation may be used to enable the purple membrane to selectively respond to ultraviolet, visible and infrared wavelengths. The fabrication process may involve cutting excess substrate material located around the sensing elements on the planar PET sheet using for example a computer numerically controlled laser micromachining in order to increase device flexibility and permit a larger bending radius of the final detector array. Once precisely cut the flexible sensing array may then be affixed to any surface geometry (e.g. cylindrical, spherical, hemispherical, and freeform) using a non conductive adhesive.

The following drawings and detailed description provide additional information about the design and fabrication of the invention, its performance capabilities, and the technology's advantage for developing innovative imaging systems.

BRIEF DESCRIPTION OF THE DRAWINGS

The non-planar imaging systems constructed in accordance with the present invention will now be described with reference to the drawings, in which.

DETAILED DESCRIPTION OF THE INVENTION

The systems described herein are directed, in general, to bioelectronic photodetector arrays fabricated on flexible electrode substrates. Although embodiments of the present invention are disclosed herein, the disclosed embodiments are merely exemplary and it should be understood that the invention relates to many alternative forms. Furthermore, the Figures are not drawn to scale and some features may be exaggerated or minimized to show details of particular features while related elements may have been eliminated to prevent obscuring novel aspects. Therefore, specific structural and functional details disclosed herein are not to be interpreted as limiting but merely as a basis for the claims and as a representative basis for enabling someone skilled in the art to employ the present invention in a variety of manner. For purposes of instruction and not limitation, the illustrated embodiments are directed to all embodiments of bioelectronic photodetectors on flexible electrode substrates.

As used herein, the term "about", when used in conjunction with ranges of dimensions, humidities, voltages or other physical properties or characteristics is meant to cover slight variations that may exist in the upper and lower limits of the ranges of dimensions so as to not exclude embodiments where on average most of the dimensions are satisfied but where statistically dimensions may exist outside this region. For example, in embodiments of the present invention bR films with thicknesses in a range from 10 to 30 µm are used but statistically there may be a few films present outside this range, say at 8 or 9 µm at the lower end and 31 or 32 µm at the upper end. It is not the intention to exclude embodiments such as these from the present invention.

As used herein, the term "bioelectronic" means using biomolecules as independent and functional device elements that are capable of interfacing with modern electronic devices as disclosed in S. Bone et al., 1992.

As used herein, the term "bacteriorhodopsin (bR)" means the light-harvesting protein presented in the plasma membrane of *Halobacterium salinarium*.

As used herein, the phrase "or analogs thereof" when referring to analogs of bacteriorhodopsin (bR) means the chromophore part of bR has been modified through chemical or genetic manipulation.

As used herein, the phrase "signal processing circuit" refers to electronic circuitry that provide necessary amplification and buffering for photoelectric signals generated by a bR sensing element.

As used herein, the term "substantially transparent" when referring to the flexible polymer substrates and the electrically conducting layers deposited on them means high light transmission in the visible spectral range.

The present invention addresses the problem of producing a photodetection system which is formed on a flexible substrate system. The present invention describes a non-planar photodetection system that is comprised of bioelectronic photodetectors and flexible electrode substrates. The photodetector is made of a light sensitive protein complex formed into in an oriented thin film, which exhibits a change in photovoltage when exposed to a change in incident light intensity. This photosensitive protein complex is coupled to transparent electrodes patterned onto the flexible polymer film substrate. The electrodes transmit the signal to a preamplifier having high input-impedance. The output signal can be further processed by specialized image processing systems to explore high-level vision tasks, such as motion detection, edge detection and contrast enhancement.

The photosensitive protein complex may include bacteriorhodopsin (bR) or its analogs. Under illumination, purple membrane patches containing bR generate photoelectric signals that can be detected by conventional electronics. The use of bR in photoelectric applications requires immobilization techniques that can appropriately orient the protein molecules and prevent them from denaturing.

Several well-known immobilization methods are available to effectively orientate purple membrane patches into a thin film form and can be applied to the present invention. Methods include deposition of purple membrane patches by EPS or Langmuir-Blodgett deposition, or encapsulation of oriented bR molecules within polymer gels as disclosed in U.S. Pat. No. 6,284,418 which is incorporated herein by reference in its entirety. An electric field is not necessarily required for Langmuir-blodgett (LB) deposition technique. The LB technique utilizes amphiphilic properties to orient purple membrane (PM) patches as the cytoplasmic side of a PM patch is more hydrophilic than the extracellular side. To improve PM patches' orientation in LB films, an electric field can be applied across the air-water interface.

A conductive polymer can also be coupled to the thin film of protein complex through either chemical or physical links, enhancing electrical conductivity between the photosensitive protein complex and electrodes.

The purple membrane patches containing bR are oriented after laying the patches down on the array of patterned conductors on one of the flexible sheets by applying an electric field of suitable strength between the parallel electrodes which are preferably separated by a 1.0 mm plastic spacer. Since the cytoplasmic side of purple membrane patches exhibits more negative charges than the extracellular side at pH values above 5, the cytoplasmic side of the membrane patches deposits to the anode electrophoretically. The continuous cathode electrode is then lifted and the bulk water is carefully removed with a pipette. The film containing oriented purple membrane patches is allowed to dry by placing it in a humidity-regulated chamber for 12 hours. When dry, a PET film with a continuous ITO coating is then aligned with the dried bR film between the two flexible polymer sheets with the continuous and patterned conductive layer and sealed carefully along the edge by using fast curing epoxy resin. The continuous cathode electrode may be the flexible polymer sheet with the continuous conductive layer or it may be another planar electrode.

Either side of PM patches can face one of two flexible electrodes, one with a continuous ITO coating and one with a patterned ITO coating. The electrodes having a continuous ITO coating that are used in orientation and in the final assembly are not necessary the same, since two different processes are involved.

The protein-based image array of the present invention may be modified to detect light over a wide spectral range by shifting spectral response peaks of individual sensing elements. Wide-type bR responds most to yellow light. Spectral characteristics can be changed through chemical or genetic manipulation as disclosed for examples in R. S. H. Liu et al., 1993; and B. Yan et al., 1995. Groups of modified bR sensing elements can be arranged in a predetermined spatial pattern, allowing detection of both color (multi-spectral) and spatial data. Each element configuration responds to a different spectral range of incident ambient light. In addition, the spectral ranges overlap, allowing intermediate wavelengths to be identified. The outputs of each sensing element can be coupled to an image processing system. The protein-based image array of the present invention is fabricated on flexible substrates coated with conductive materials. Flexible plastic sheets, such as polyethylene terephthalate (PET), are chosen to replace solid substrate materials. Other flexible polymer materials that could be used for the top and bottom flexible substrates include polyethylene naphthalate (PEN), polycarbonate (PC) and polyimide to mention just a few. It is not necessary that both polymer films be transparent. However, using transparent polymer films on both sides will give more flexibility (or more choices) when affixing the imaging array to different geometries.

Photodetection devices require a transparent conductive layer with high electrical conductivity and low visible light absorption. This layer can be prepared from a wide variety of materials, including doped semiconductor oxides of tin, indium, zinc, or cadmium and titanium nitride ceramics, as well as thin metal layers of silver or gold. Among them, the most widely adopted solutions are conducting oxides of tin ($SnO_2$:F), zinc ($ZnO_2$:F) and indium ($In_2O_3$:Sn, ITO). Although indium is a costly raw material and its tin-doped oxide is moderately more difficult to etch than zinc oxide. However, it allows for very low deposition temperatures ($\leqq 200°$ C.) and provides high conductivity, making it ideal for deposition on thin flexible plastic substrates. As with the electrodes discussed above, it is not necessary that both electrodes be substantially transparent. However, using transparent electrodes on both sides will give more flexibility (or more choices) when affixing the imaging array to different geometries.

The thin film containing purple membrane patches preferably has a thickness in a range from about 10 μm to about 30 μm. The first and second flexible polymer sheets preferably have a thickness in a range from about 10 μm about 250 μm. The patterned coating of a substantially transparent electrically conducting film preferably has a thickness in a range from about 100 Å to about 2000 Å.

The shape and size of the patterned array, as well as the shape and size of the individual sensing elements, are key factors to be considered in the design and manufacture of the flexible photodetector device. The individual element shape (e.g. circular, square or hexahedral) may affect mechanical properties of the flexible device and therefore certain shapes may be preferred for a particular end-use application or cut-out pattern. Similarly, the sensing element size may affect the manner in which the PM patches can be located on the substrate. The density of sensing elements directly affects the resolution of the imaging array. In this context, a non-uniform distribution of various sized sensing elements are also possible to obtain high resolution (small size, high density) in the center and low resolution (large size, low density) in the peripheral region of the image array. Furthermore, the subunits of a sensing element may be formed from two or more of the PM patches with different spectral characteristics.

Preferred methods for coating the flexible substrate include pulsed laser deposition and magnetron sputtering. Pulsed laser deposition is able to pattern the electrode directly and eliminate the etching process. However, this method is costly and often limited to small areas. An alternative is to use magnetron sputtering for large-scale applications and high volume production. Since photomasks are used for patterning ITO coating on the plastic film, innovative ITO electrode pattern designs can be developed using a 2D CAD tool. In this manner, it is straightforward to modify the sensing element density, dimensions and geometry prior to fabrication.

Excess substrate material on the initial flat patterned image array can be removed using laser cutting technology for increased flexibility. Once cut the flexible sensing array can be affixed to the desired surface geometry using a transparent non-conductive adhesive. Light can be focused onto the non-planar imaging array elements using a conventional convex optical lens or multiple micro lenses. Microlens arrays that are fabricated onto a thin silicon elastomer by using UV exposure can be employed to developing compact-lens sensor that mimics apposition compound eyes (G. Schmidt and D. T. Moore, 2006).

The signal processing circuitry is designed in the present invention to detect the small photovoltage signal generated by a bR sensing element that exhibits significantly high impedance. Two examples include using transimpedance amplifiers and switched integrators as the preamplifiers to increase the measured output signal from the individual sensing elements. Each element may be read in parallel from the array or scanned serially, provided that high-impedance transistors are used as amplification components and these devices are appropriately integrated with each element on the array; Protein-based imaging arrays of the present invention can be used as a conformal sheet applied to curved structures (e.g. sphere, hemispherical cavity) or flexible materials.

The present invention will now be illustrated with the following non-limiting examples.

EXAMPLE

Figure 1A:
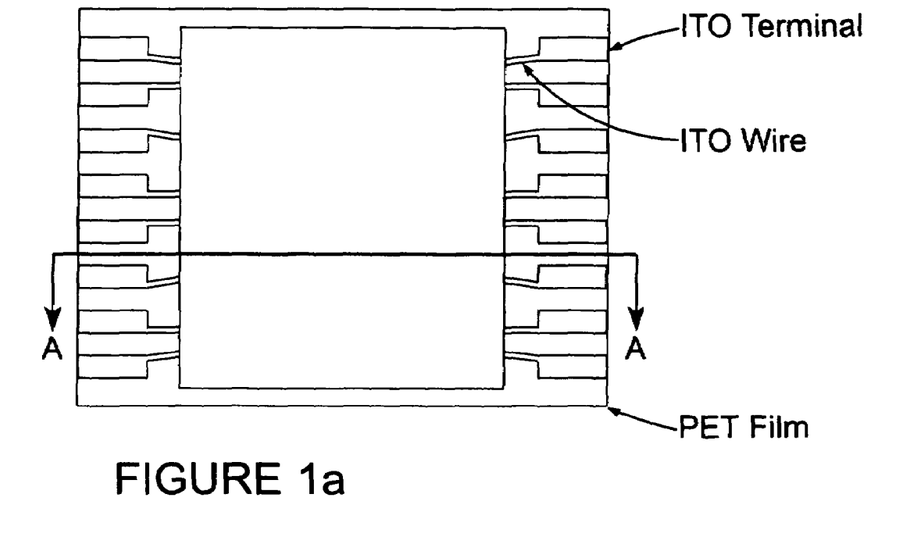
FIG. 1a shows a schematic diagram of non-planar imaging array formation, looking down from the top, in accordance with the present invention.
Figure 1B:
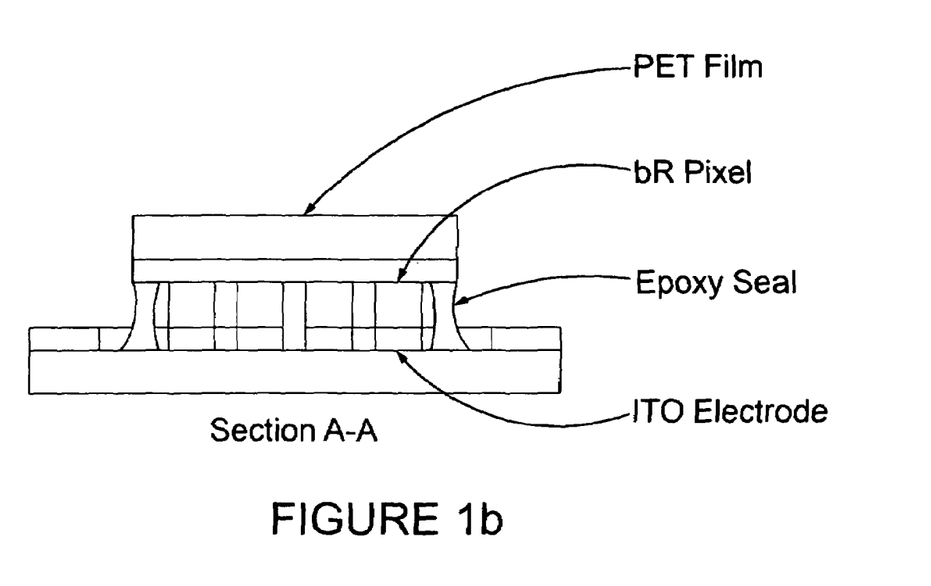
FIG. 1b shows a view of the structure of FIG. 1a along the line A-A.

A simple implementation of the protein-based flexible imaging array is shown in FIGS. 1a and 1b. The imaging array is comprised of oriented bR films and two PET films, one with a patterned ITO layer coating corresponding to a desired pattern of pixels and one with a continuous ITO layer. Purple membrane patches containing bR are extracted from wild-type *Halobacterium salinarium* by using a standard procedure as disclosed in D. Oesterhelt and W. Stoeckenius, 1974. In order to remove sucrose and salt ions, the purple membrane suspension is purified by diluting with bi-distilled water and then isolated by centrifugation. The ultracentrifuge operates at 22400 rpm at 4° C. for 30 minutes with a 50-Ti rotor. After the rinsing cycle, the supernatant is carefully removed and the PM pellet is re-suspended in bi-distilled water. This centrifugation process is repeated two more times and the final purple membrane pellet is suspended in bi-distilled water to achieve a desired concentration of 16 mg/ml. This sample is then softly sonicated for 10 seconds to break up particle aggregation. Upon the completion of three rinse cycles, the pH of the suspension is roughly 6.7, which eliminates the need for acidification or alkalization of the sample.

The flexible substrate is made of a flexible 175 μm thick PET film which provides high light transmission (typically >86%) over the visible spectral range. A patterned ITO layer is deposited onto the flexible substrate via pulsed laser deposition. The ITO coated film has a surface resistance of 35 ohms/sq. In an embodiment, the ITO electrode is imprinted as a 4×4 pixel array pattern where each pixel is 2 mm×2 mm and is separated by 1 mm between neighboring pixels. Independent ITO wires, each 300 μm wide, connect the pixel with a connection terminal along substrate edge. The overall area of a patterned ITO electrode is 15 mm by 23 mm. It will be appreciated that in the patterned coating of the substantially transparent and electrically conducting film (e.g. ITO), the patterned coating corresponds to any desired pattern or array, of pixels, which may also be referred to as a pixilated array.

Figure 2A:
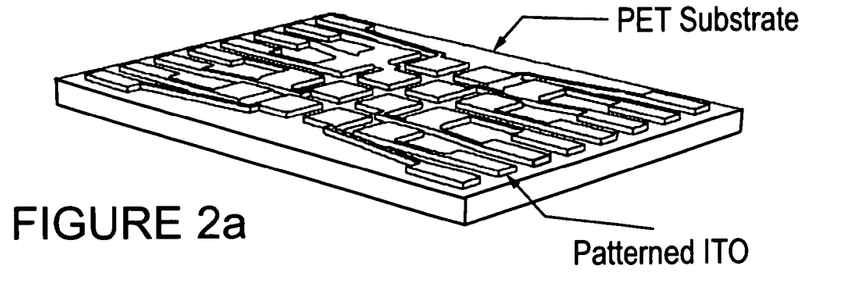
FIGS. 2a, 2b, 2c and 2d show the fabrication process for producing the photoactive array of FIGS. 1a and 1b.
Figures 2B, 2C:
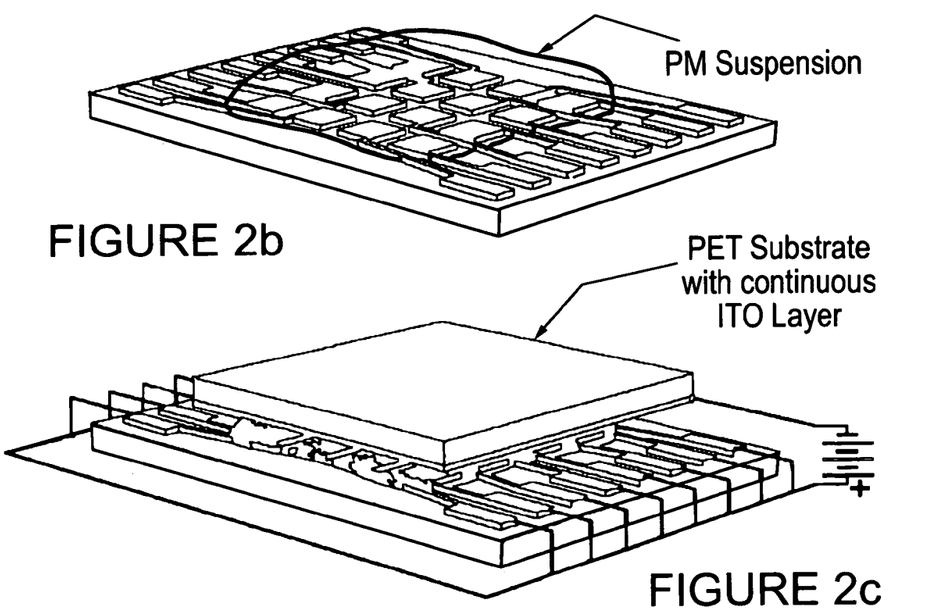
Figure 2D:
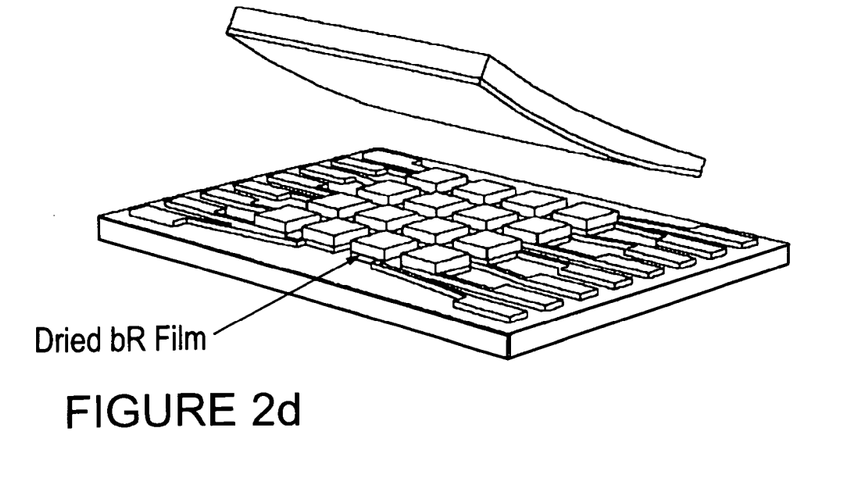

In the construction of FIGS. 2a and 2b, the patterned electrode surface is first cleaned of all residues, and then 100 μL of PM suspension is spread evenly over the patterned surface. A 1.0 mm plastic spacer is placed around the array to separate the two electrodes, where the bottom ITO electrode is patterned and the top ITO electrode is continuous, are connected to the positive and negative terminals of the power supply as shown in FIG. 2c. An electric field of 40 V/cm is then applied. The top electrode is lifted and the remaining bulk water is carefully removed with a pipette. After 12 hours of drying, the top electrode is attached and sealed carefully along the edge by using fast-curing epoxy resin as shown in FIG. 2d.

The fabrication conditions such as the electric field intensity, exposure time and ambient drying humidity all affect the photoelectric response and topology of the bR film. Experimental observations have shown that noticeable aggregation of bR molecules can occur at very low electric field intensities, forming poorly oriented films and diminish the photoelectric response. Excessively high electric field intensities reduce aggregation, but also reduce sensor performance due to protein degradation. An intermediate electric field in a range from about 20 V/cm to about 60 V/cm are useful, preferably applying a field of approximately 40 V/cm for about five minutes produces the best results. Relative humidity in the range of 50%~60% typically yields the best photoelectric signals. Constant humidity can be achieved by drying the film in the presence of vapor generated by a saturated salt solution.

Figure 3:
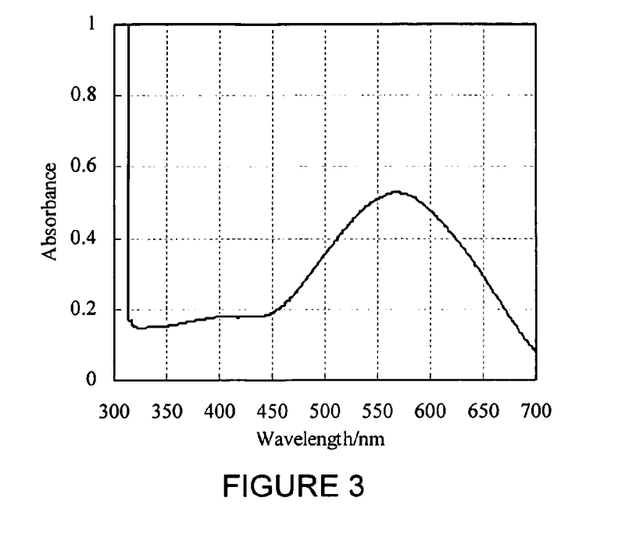
FIG. 3 shows absorption spectrum of a bR-ITO-PET film that is normalized to the baseline absorption of the ITO-PET substrate.

Fabrication quality is verified by measuring the absorption spectrum of the bR film deposited on the ITO-PET substrate. An ultraviolet-visible spectrophotometer (Varian, Cary 50Bio) is used to record the absorption spectra. FIG. 3 shows the spectrum of bR-ITO-PET film that is normalized to the baseline absorption of ITO-PET substrate. A broad peak, from 550 nm to 580 nm, is observed for the bR-ITO-PET film. Successful deposition shows that the 570 nm absorption peak found in the purple membrane suspension is also preserved in the bR-ITO-PET film.

Figure 4:
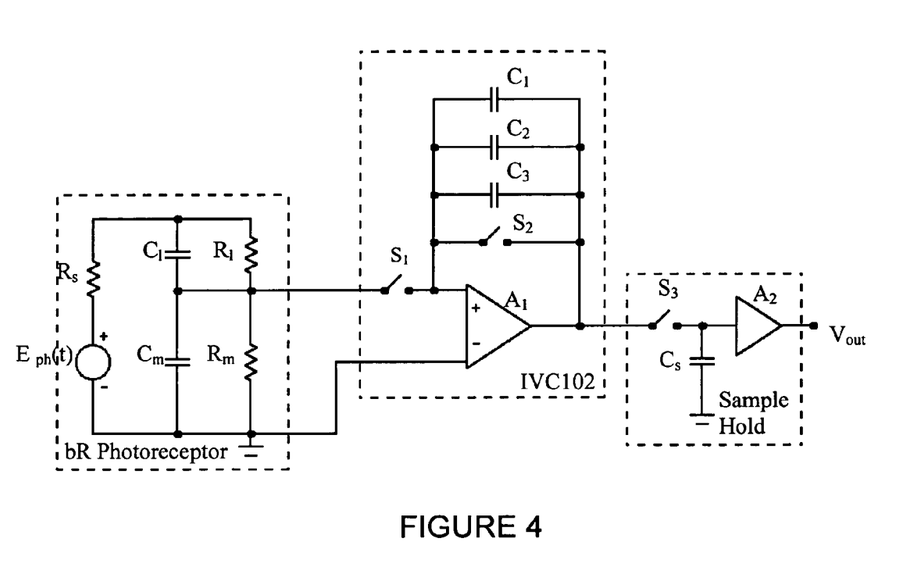
FIG. 4 shows a schematic diagram of a preamplifier configuration for one bR sensing element in which the three dashed boxes include the simplified bR model, IVC 102 switched integrator and sample/hold circuitry.

An equivalent circuit model of a bR sensing element is given in the left dashed box shown in FIG. 4. The components in this model correspond to analogues in the bR element's physical model. The overall behavior of the bR molecule is that of a current generator, I(t). Considering the finite resistance of protein medium, $R_s$, the current source can also be described by an equivalent electric potential source, $E_{ph}(t)$. Since the lipids within the membrane exhibit a high dielectric constant, they can be modeled as the combination of a series capacitor $C_l$ and a series resistor $R_l$. The parallel combination of resistor $R_m$ and capacitor $C_m$ with the current source describes the behavior in non-illuminated bR molecules in conjunction with lipids that are perpendicular to the bR orientation direction.

The resistance of a bR element is in the range of $10^{10}$-$10^{12} \Omega$, therefore its performance highly depends on the electronic circuitry used to condition and amplify the extremely-small signal. A highly optimized electronic circuit with high input-impedance and low noise amplification is designed. The proposed design employs a switched integrator as a preamplifier for each sensing element. FIG. 4 shows a detailed circuit diagram in which a precision switched integrator, IVC102, combines a FET op amp, integrating capacitors and low leakage FET switches onto a single chip. The sensing element output connects to the inverting input via a sample switch $S_1$, where the non-inverting input is grounded. The reset switch $S_2$ is in parallel with the integrating capacitors to provide a discharge path. Amplifier output is connected to a holding capacitor via a readout switch $S_3$. The digital timing inputs to $S_1$-$S_3$ are compatible with standard CMOS or TTL logic signals. A PIC12F675 microcontroller is used to control the digital timing functions. A multi-channel readout architecture is used to transfer the information processed by each element to the processing circuitry. This design simplifies array fabrication since no shift registers need to be considered at this time. The multi-channel design also reduces the information to be transferred and increases the transfer bandwidth.

Figure 5:
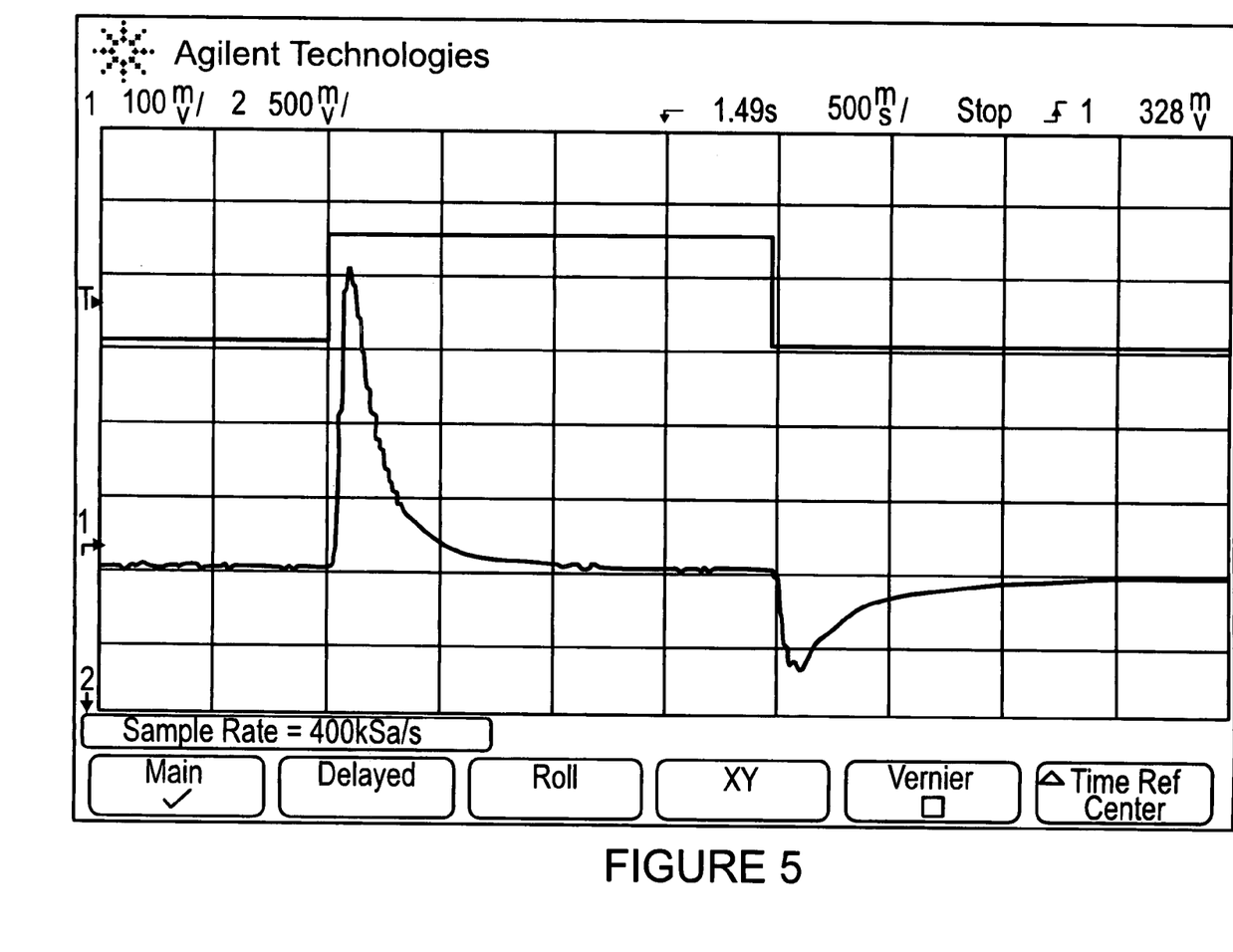
FIG. 5 shows the differential photoresponse (the bottom plot) generated by a bR sensing element to a step light signal (the top square wave signal)
Figure 6:
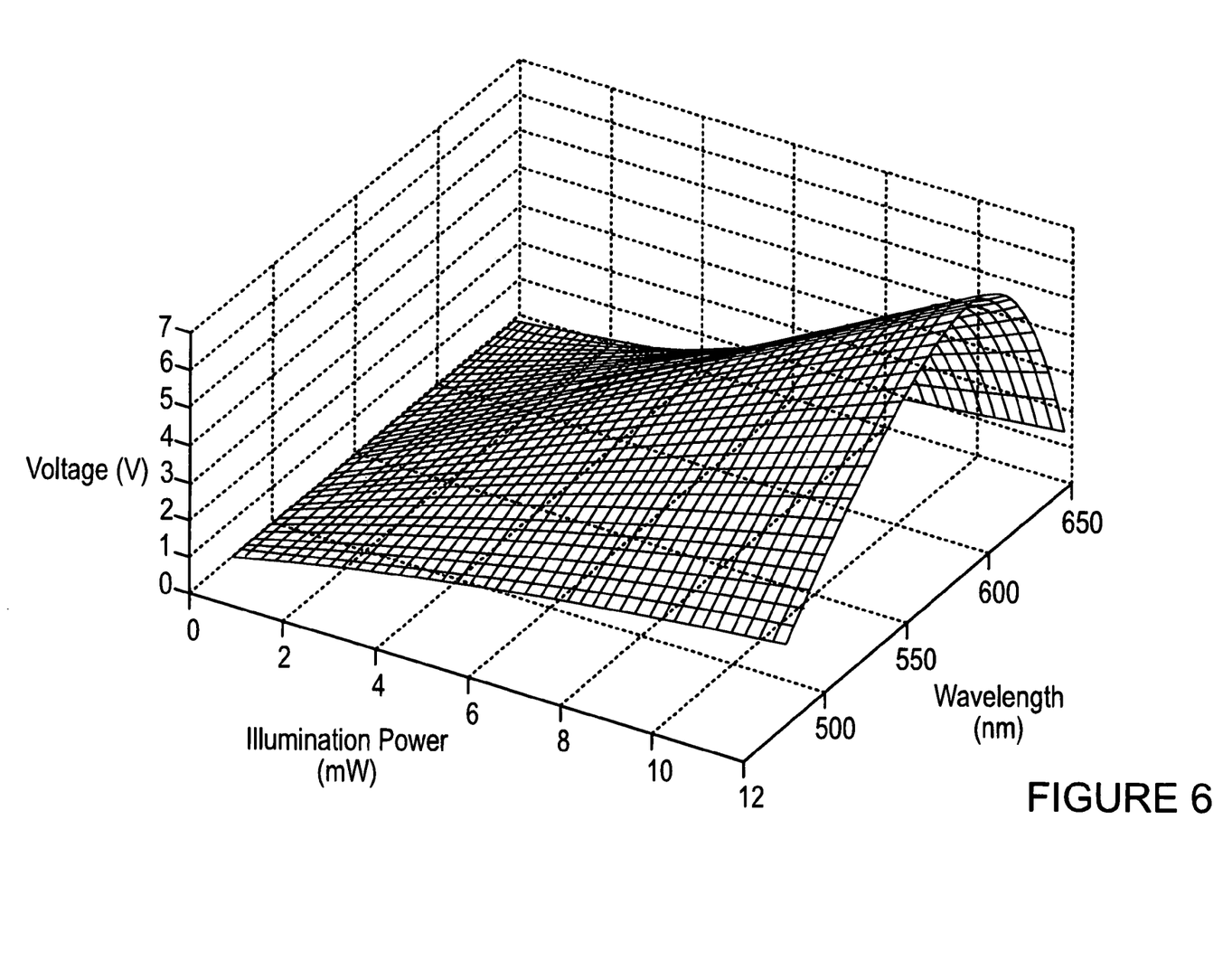
FIG. 6 shows measured photovoltage of a bR sensing element over varying wavelength and illumination power.

FIG. 5 shows a differential photoresponse generated by a bR sensing element when illuminated by a step light signal. It illustrates that polarity of the photoresponse changes at the rising and falling edges of the input step signal, which corresponds to the charge displacement inside the bR film. The peak of the differential response varies directly with changes in light intensity provided that saturation does not occur. The magnitude of such response is also dependent upon the wavelength of the incident light. Wavelength dependent response is measured using a tunable Argon/Krypton laser system that produces seven wavelengths covering the whole visible range. FIG. 6 shows experimental data plotted in a 3D space, where the measured photovoltage is a function of both illumination power and wavelength.

Accordingly, the present invention provides a novel design for a photodetection device which functions as a result of the photosensitive properties of proteins and which allows for detection a wide range of incident light intensities and wavelengths in a wide FOV. The invention will now be described using the following non-limiting examples of producing hemispherical imaging system which is meant to be illustrative only and not limiting to the scope of the present invention.

While the present invention is described with respect to particular examples, it is understood that the present invention is not limited to any one of the embodiments shown herein. The invention as claimed includes variations from the particular examples and preferred embodiments described herein, as will be apparent to one of skill in the art.

The protein-based design and fabrication methodology would enable a variety of geometries of photodetection systems to be created. A hemispherical imaging system that can emulate the characteristics of either single aperture eye or apposition compound eye is given as an example.

Figure 7:
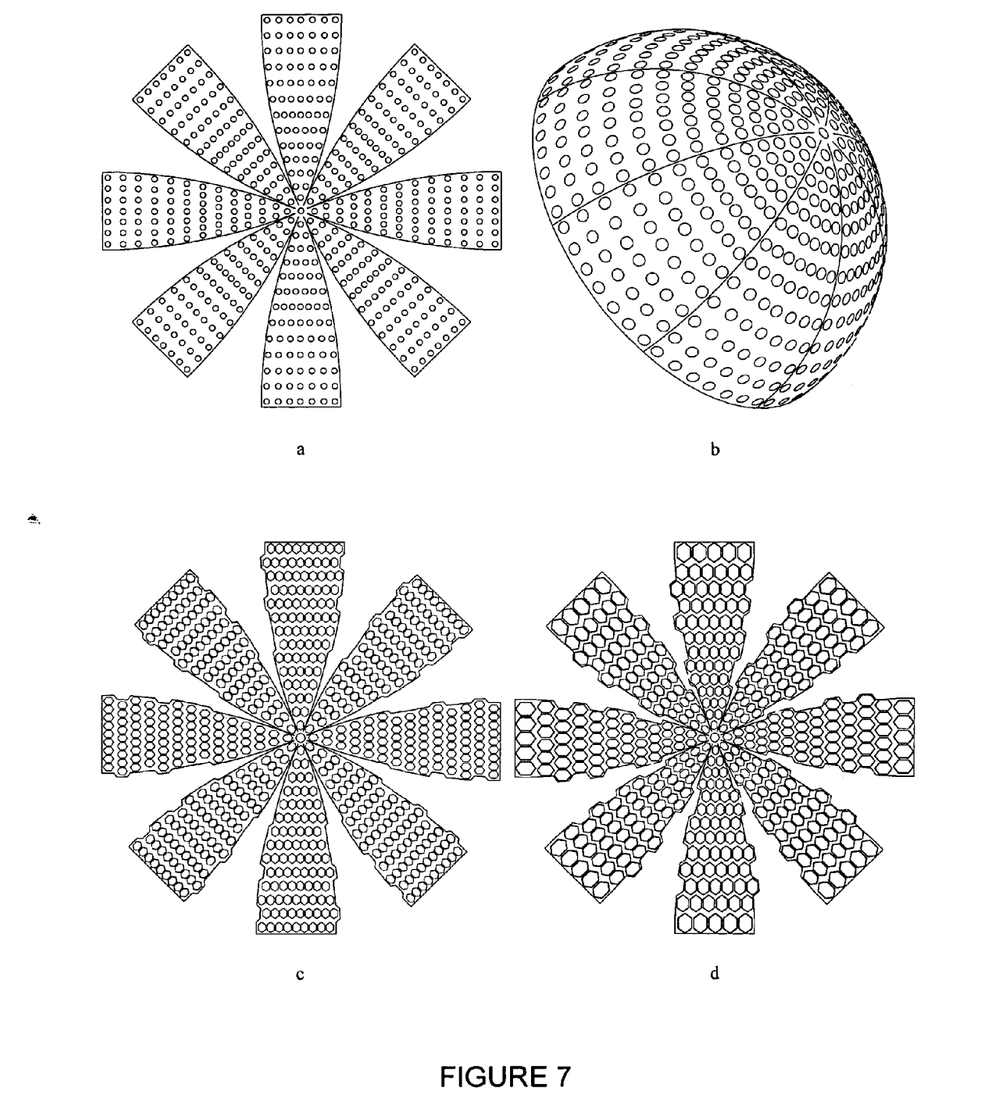
FIG. 7a shows a uniform circle pattern design of ITO electrodes on planar PET film. Note that the excess substrate material located among the sensing element petals on the planar PET sheet is cut by laser in order to permit a larger bending radius of the sensing array.
FIG. 7b shows the flexible sensing array is affixed to a hemispherical geometry.
FIG. 7c and FIG. 7d show a uniform and a non-uniform hexagonal pattern designs of ITO conductive layers on planar PET film.

The ITO electrode pattern is designed as shown in FIG. 7a. This design is transferred to an image, which is then used to develop a photomask. A conductive ITO layer is deposited onto a planar PET substrate via pulsed laser deposition. Excess substrate material located along the sensing element petals on the planar PET sheet is cut by laser to permit a larger bending radius of the sensing array. Thin layers of purple membrane patches containing bR is then immobilized onto the patterned ITO electrode using one of the preferred methods. The individual elements can be made of wild-type bR with its analogs thereby achieving a wide absorption range. Purple membrane patches can also be encapsulated into organic/inorganic material matrix to achieved enhanced robustness. A continuous ITO-PET film with the same shape is carefully aligned on the top of bR-ITO-PET film and sealed along the edges using a transparent adhesive. As shown in FIG. 7b, the flexible PET-ITO-bR-ITO-PET imaging array is affixed to a hemispherical geometry.

Non uniform distribution of light sensing elements is quite common in biological vision systems. The photoreceptors on the hemispherical surface of a single aperture eye found in higher order animals reflect a complex spatial pattern that permits a dense concentration of frequency-selective receptors along the optic axis and a wider distribution of intensity sensitive receptors in the peripheral regions. The present invention provides a promising approach to mimic such aspects of biological vision systems. FIG. 7c and FIG. 7d show uniform and non-uniform hexagonal pattern designs of ITO conductive layers on a planar PET film.

Single and multi-spectral bioelectronic sensing technology fabricated on bendable plastic substrates as disclosed herein offers a number of significant advantages over conventional silicon-based microelectronics (e.g. CMOS) and bR-based devices manufactured on rigid substrates, which include reduction in spatial requirements, weight, electrical power consumption, thermal heat loss, system complexity, and fabrication cost.

The direct deposit of photosensitive materials onto low-cost flexible printed electronic circuits also enables design engineers to create innovative lightweight, durable and non-planar image sensing systems. For example, spherical or omni-directional photodetector array based on bR films can be used in a variety of imaging applications including motion detection, robotic and vehicle navigation, surveillance of work environments, and biosensing. The non-planar shape of the sensing array provides a number of unique advantages such as increased FOV for single aperture camera systems, and direct sensing capability for a compact apposition "compound eye".

By manufacturing patterned imaging arrays on bendable substrates it is also possible to develop photo-responsive sensors that can be adhered permanently to non-planar customized surfaces or, in the near future, rolled up when not in operation. An example is that a large area flexible bioelectronic sensor array can be used to create an "intelligent skin" which can be adhered directly to the shell of land, air and marine vehicles.

As used herein, the terms "comprises", "comprising", "including" and "includes" are to be construed as being inclusive and open ended, and not exclusive. Specifically, when used in this specification including claims, the terms "comprises", "comprising", "including" and "includes" and variations thereof mean the specified features, steps or components are included. These terms are not to be interpreted to exclude the presence of other features, steps or components.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

REFERENCES CITED

| U.S. PATENT DOCUMENTS | | |
|---|---|---|
| 4,647,161 | March 1987 | Muller et al. |
| 5,260,559 | November 1993 | Miyasaka |
| 5,438,192 | August 1995 | Kaplan et al. |
| 5,627,616 | May 1997 | Sergeant et al. |
| 5,920,337 | July 1999 | Glassman et al. |
| 6,284,418 | September 2001 | Trantolo |
| 6,304,285B1 | October 2001 | Geng et al. |
| 6,977,160 | December 2005 | Yanagawa et al. |
| FOREIGN PATENT DOCUMENTS | | |
| 04006420A2 | April 1990 | |
| 03237769A2 | November 1990 | |
| 06235606A2 | May 1993 | |

OTHER PUBLICATIONS

J. Xu, P. Bhattacharya, G. Váró, "Monolithically integrated bacteriorhodopsin/semiconductor opto-electronic integrated circuit for a bio-photoreceiver", Biosensors & Bioelectronics, vol. 19, pp. 885-892, 2004.

C. Horn, C. Steinem, "Photocurrents generated by bacteriorhodopsin adsorbed on nano-black lipid membranes", Biophys. J. vol. 89, pp. 1046-1054, 2005.

S. Bone and B. Zaba, "Bioelectronics", Chichester: John Wiley & Sons Ltd., 1992.

R. S. H. Liu, E. Krogh, X.-Y. Li, D. Mead, L. U. Colmenares, J. R. Thiel, J. Ellis, D. Wong and A. E. Asato, "Analyzing the red-shift characteristics of azulenic, naphthyl, other ring-fused and retinyl pigment analogs of bacteriorhodopsin", Photochem. Photobiol., Vol. 58, pp. 701-705, 1993.

B. Yan, J. L. Spudich, P. Mazur, S. Vunnam, F. Derguini and K. Nakanishi, "Spectral tuning in bacteriorhodopsin in the absence of counterion and coplanarization effects", J Biol Chem, vol. 270, pp. 29668-29670, 1995.

G. Schmidt and D. T. Moore, "Formable compound microlens arrays", SPIE Newsroom, 2006. http://newsroom.spie.org/x4676.xml (DOI: 10.1117/2.1200609.0405)

D. Oesterhelt and W. Stoeckenius, "Isolation of the cell membrane of *alobacterium halobium* and its fractionation into red and purple membrane", Methods. Enzymol., vol. 31, pp. 667-678, 1974.

Therefore what is claimed is:

1. Flexible photodetector array, comprising of:
a first flexible polymer sheet coated with a continuous electrically conducting film forming one of an anode and a cathode electrode, a second flexible polymer sheet having a patterned coating of a electrically conducting film forming the other electrode, the patterned coating corresponding to a desired pattern of pixels, at least one of the first flexible polymer sheet coated with a continuous, electrically conducting film and the second flexible polymer sheet having a patterned coating of a electrically conducting film being substantially transparent;
a thin film containing one or more layers of oriented purple membrane patches containing bacteriorhodopsin (bR), or an analog thereof, sandwiched between the first and second flexible polymer sheets with the electrically conducting film physically contacting one side of the thin film and the patterned coating of an electrically conducting film contacting an opposed side of the thin film to form a pixel array of sensing elements; and
the continuous, electrically conducting film and the patterned coating of an electrically conducting film being electrically connected to a signal processing circuit.

2. The flexible photodetector array according to claim 1 wherein the oriented purple membrane patches containing bR are oriented such that cytoplasmic sides of all purple membrane patches face to one direction and extracellular sides of all purple membrane patches face to the opposite direction, and wherein either the cytoplasmic sides or the extracellular sides being immobilized to the flexible polymer sheet having a patterned coating of an electrically conducting film.

3. The flexible photodetector array according to claim 1 wherein the purple membrane patches containing bR are extracted from wild-type *Halobacterium salinarium*.

4. The flexible photodetector array according to claim 1 wherein the purple membrane patches containing bR have a thickness in a range from about 10 µm to about 30 µm.

5. The flexible photodetector array according to claim 1 wherein the first and second flexible polymer sheets have a thickness in a range from about 10 µm about 250 µm.

6. The flexible photodetector array according to claim 1 wherein the patterned coating of an electrically conducting film have a thickness in a range from about 100 Å to about 2000 Å.

7. The flexible photodetector array according to claim 1 wherein said first and second flexible polymer sheets are made from a polymer selected from the group consisting of polyethylene terephthalate (PET), polyethylene naphthalate (PEN), polycarbonate (PC) and polyimide.

8. The flexible photodetector array according to claim 1 wherein a group of bR sensing elements with predetermined shapes and sizes forms one single photodetector, and a subunit of the photodetector wherein the bR sensing element is formed from two or more of said purple membrane patches.

9. The flexible photodetector array according to claim 1 wherein said group of modified bR sensing elements are arranged in accordance with at least one characteristic of the purple membrane patches.

10. The flexible photodetector array according to claim 9 wherein said at least one characteristic is a spectral characteristic.

11. The flexible photodetector array according to claim 1 wherein said first and second flexible polymer sheets enclosing said bR thin films has a pre-selected planar shape and is affixed to a non-planar surface.

12. The flexible photodetector array according to claim 11 wherein said non planar surface is any one of cylindrical, spherical, hemispherical, or freeform geometries.

13. The flexible photodetector array according to claim 11 wherein said non planar surface is a convex or concave surface.

14. The flexible photodetector array according to claim 1 wherein said thin film containing one or more than one layers of oriented purple membrane patches forming said pixel array comprise two or more types of purple membrane patches with different bR characterized by different wavelength sensitivities spanning the spectral region from infrared to ultraviolet wavelengths, said two or more types of purple membrane patches being arrayed in a desired pattern on said patterned coating of an electrically conducting film.

15. The flexible photodetector array according to claim 1 wherein said electrically conducting film and the patterned coating of a electrically conducting film are made of a conducting metal oxide.

16. The flexible photodetector array according to claim 15 wherein said conducting metal oxide is selected from the group consisting of tin oxides ($SnO_2$:F), zinc oxides ($ZnO_2$:F) and indium oxides $In_2O_3$:Sn (ITO).

17. The flexible photodetector array according to claim 1 including a plurality of optical components affixed to at least one of said first and second flexible polymer sheets with each of said optical components being associated with a particular bR sensing element or a group of bR sensing elements, each optical component being shaped and configured for focusing incident light onto its associated bR sensing element or a group of bR sensing elements.

18. The flexible photodetector array according to claim 17 wherein said optical component is a microlens.

19. The flexible photodetector array according to claim 1 including an amplifier electrically connected to each sensing element to amplify electric signals generated by each sensing element.

20. The flexible photodetector array according to claim 19 wherein said amplifier is a transimpedance amplifier.

21. The flexible photodetector array according to claim 19 wherein said amplifier is a switched integrator.

22. The flexible photodetector array according to claim 1 including parallel readout circuitry connected to each sensing element of said array.

23. The flexible photodetector array according to claim 1 including scanning readout circuitry connected to said array of pixels.

24. A method of fabricating a flexible photodetector array, comprising the steps of:
   a) coating a first flexible polymer sheet with a continuous electrically conducting film;
   b) coating a second flexible polymer sheet with a patterned coating of an electrically conducting film, the patterned coating corresponding to a desired pattern of sensing elements, at least one of the first flexible polymer sheet coated with a continuous, electrically conducting film and the second flexible polymer sheet having a patterned coating of a electrically conducting film being substantially transparent;
   c) orienting the purple membrane patches containing (bR), or an analog thereof, and forming a film containing one or more layers of oriented purple patches and immobilizing the film onto the flexible polymer sheet coated with the patterned electrically conducting film; and
   d) affixing the film containing one or more layers of oriented purple membrane patches between the first and second flexible polymer sheets, with the electrically conducting film physically contacting one side of the film and the patterned coating of an electrically conducting film contacting an opposed side of the film to form an array of sensing elements and sealing peripheral edges of the first and second flexible polymer sheets.

25. The method according to claim 24 wherein the purple membrane patches containing bR are oriented using any one of Electrophoretic Sedimentation (EPS), Langmuir-Blodgett deposition and encapsulation into organic/inorganic material matrix.

26. The method according to claim 24 wherein said step of orienting the purple membrane patches containing bR includes locating the purple patches between the second flexible polymer sheet designated an anode and a continuous planar cathode electrode and applying an electric field of suitable strength between the planar cathode and anode electrodes such that a cytoplasmic side of the purple membrane patches face to the anode electrode electrophoretically and an extracellular side of the purple membrane patches face to the cathode electrode.

27. The method according to claim 26 wherein the purple membrane patches containing bR are oriented by applying an electric field in a range from about 20 V/cm to about 60 V/cm.

28. The method according to claim 27 wherein the electric field is about 40 V/cm and is applied for about five minutes.

29. The method according to claim 24 wherein after step c) and prior to step d) the film containing oriented purple membrane patches is dried in a humidity-regulated chamber for about 12 hours.

30. The method according to claim 29 wherein the film containing oriented purple membrane patches is dried for about 12 hours.

31. The method according to claim 24 wherein the purple membrane patches containing bR are extracted from wild-type *Halobacterium salinarium*.

32. The method according to claim 24 including chemically or genetically modifying individual purple membrane patches containing bR for modifying spectral characteristics of the individual purple membrane patches over the ultraviolet, visible and infrared wavelengths regions, and once they have been oriented, laying down said chemically or genetically modified individual purple membrane patches in a preselected pattern of sensing elements.

33. The method according to claim 24 wherein a group of bR sensing elements with predetermined shapes and sizes forms one single photodetector, and a subunit of a photodetector wherein the bR sensing element is formed from two or more of said purple membrane patches.

34. The method according to claim 33 wherein said group of modified bR sensing elements are arranged in said array in accordance with at least one characteristic of the purple membrane patches.

35. The method according to claim 34 wherein said at least one characteristic is a spectral characteristic.

36. The method according to claim 24 including a step of forming the flexible photoconductor array into a desired planar shape and affixing the shaped flexible photoconductor array to a non-planar surface.

37. The method according to claim 36 wherein said non planar configuration is any one of cylindrical, spherical, hemispherical, or freeform geometries.

38. The method according to claim 36 wherein said non planar non-planar surface is a convex or concave surface.

39. The method according to claim 24 wherein said first and second flexible polymer sheets are made from a polymer selected from the group consisting of polyethylene terephthalate (PET), polyethylene naphthalate (PEN), polycarbonate (PC) and polyimide.

* * * * *